(12) United States Patent
Xiao et al.

(10) Patent No.: US 10,078,992 B2
(45) Date of Patent: *Sep. 18, 2018

(54) SCAN DRIVING CIRCUIT HAVING SIMPLE STRUCTURE AND HIGH RELIABILITY

(71) Applicant: Wuhan China Star Optoelectronics Technology Co., Ltd., Wuhan (CN)

(72) Inventors: Juncheng Xiao, Wuhan (CN); Mang Zhao, Wuhan (CN); Yong Tian, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 328 days.

This patent is subject to a terminal disclaimer.

(21) Appl. No.: 14/783,095

(22) PCT Filed: Aug. 10, 2015

(86) PCT No.: PCT/CN2015/086483
§ 371 (c)(1),
(2) Date: Oct. 8, 2015

(87) PCT Pub. No.: WO2016/192199
PCT Pub. Date: Dec. 8, 2016

(65) Prior Publication Data
US 2016/0358568 A1    Dec. 8, 2016

(30) Foreign Application Priority Data

Jun. 4, 2015    (CN) .......................... 2015 1 0304146

(51) Int. Cl.
*G09G 3/36*    (2006.01)
*G11C 19/28*    (2006.01)

(52) U.S. Cl.
CPC .......... *G09G 3/3674* (2013.01); *G11C 19/28* (2013.01); *G09G 2310/0286* (2013.01); *G09G 2320/0223* (2013.01); *G09G 2320/041* (2013.01); *G09G 2330/021* (2013.01)

(58) Field of Classification Search
CPC .......... G09G 3/3674; G09G 2320/041; G09G 2320/0223; G11C 19/28
See application file for complete search history.

(56) References Cited

U.S. PATENT DOCUMENTS

| 9,792,845 | B2 * | 10/2017 | Xiao | G09G 3/20 |
| 9,865,213 | B2 * | 1/2018 | Xiao | G11C 19/287 |
| 2012/0050234 | A1 * | 3/2012 | Jang | G09G 3/3225 345/204 |
| 2014/0062848 | A1 | 3/2014 | Jinta et al. | |
| 2015/0015558 | A1 * | 1/2015 | Sasaki | G09G 3/3677 345/211 |

(Continued)

FOREIGN PATENT DOCUMENTS

| CN | 104078019 | 10/2014 |
| CN | 104485079 | 4/2015 |

*Primary Examiner* — Jonathan Blancha

(57) ABSTRACT

A scan driving circuit is disclosed for executing a driving operation for cascaded scan lines and includes a pull-down control module, a pull-down module, a reset control module, a reset module, a down-stream module, a first bootstrap capacitor, a constant low-level voltage source utilized, and a constant high-level voltage source. The whole structure of the disclosed scan driving circuit is simple, and power consumption is low.

20 Claims, 6 Drawing Sheets

(56) References Cited

U.S. PATENT DOCUMENTS

2016/0086562 A1\* 3/2016 Tan .................... G09G 3/3677
                                                         345/215
2016/0189648 A1   6/2016 Xiao
2016/0267832 A1   9/2016 Dai \* cited by examiner

SCAN DRIVING CIRCUIT HAVING SIMPLE STRUCTURE AND HIGH RELIABILITY

RELATED APPLICATIONS

This application is a National Phase of PCT Patent Application No. PCT/CN2015/086483 having International filing date of Aug. 10, 2015, which claims the benefit of priority of Chinese Patent Application No. 201510304146.X filed on Jun. 4, 2015. The contents of the above applications are all incorporated by reference as if fully set forth herein in their entirety.

BACKGROUND OF THE INVENTION

1. Field of the Invention

The present invention generally relates to a display driving field, and more particularly to a scan driving circuit.

2. Description of Prior Art

A gate driver on array, which is referred to as GOA, is to manufacture a scan driving circuit on an array substrate in a conventional thin film transistor liquid crystal display, so as to implement a driving manner in which a progressive scan is performed to scan lines. A conventional scan driving circuit comprises a pull-down control module, a pull-down module, a down-stream module, a reset control module, a bootstrap capacitor, and a reset control module.

When the scan driving circuit is operated at a high temperature, a delay problem and an electrical leakage problem easily occur. Accordingly, the reliability of the scan driving circuit is affected.

Consequently, there is a need to provide a scan driving circuit for solving the above-mentioned problems in the prior art.

SUMMARY OF THE INVENTION

An objective of the present invention is to provide a scan driving circuit which has a simple structure and a high reliability for solving the technical problems that the structure of a conventional scan driving circuit is complex and the reliability is low.

To solve the above-mentioned problems, a technical scheme of the present invention is described as follows.

A scan driving circuit provided by an embodiment of the present invention is utilized for executing a driving operation for cascaded scan lines and comprises:

A pull-down control module utilized for receiving a previous-stage scan signal and generating a low-level scan signal corresponding one of the scan lines according to the previous-stage scan signal;

A pull-down module utilized for pulling down a scan signal of the corresponding scan line according to the low-level scan signal;

A reset control module utilized for receiving a next-stage clock signal and generating a reset signal of the corresponding scan line according to the next-stage clock signal;

A reset module utilized for pulling up the scan signal of the corresponding scan line according to the reset signal;

A down-stream module utilized for generating and transmitting a present-stage clock signal and a present-stage pull-down control signal according to the scan signal of the scan line;

A first bootstrap capacitor utilized for generating a high level or a low level of the scan signal of the scan line;

A constant low-level voltage source utilized for providing a low-level signal; and A constant high-level voltage source utilized for providing a high-level signal.

The scan driving circuit utilizes P-type metal-oxide-semiconductor field-effect transistors or N-type metal-oxide-semiconductor field-effect transistors to control the pull-down control module, the pull-down module, the reset control module, and the reset module.

The pull-down control module further receives a next-stage scan signal and generates the low-level scan signal of the corresponding scan signal according to the next-stage scan signal.

The reset control module further receives a previous-stage clock signal and generates the reset signal of the corresponding scan signal according to the previous-stage scan signal.

In the scan driving circuit of the present invention, the pull-down control module comprises a first switch transistor. The low-level scan signal is inputted to a control end of the first switch transistor. The previous-stage scan signal is inputted to an input end of the first switch transistor. An output end of the first switch transistor is coupled to the pull-down module.

In the scan driving circuit of the present invention, the pull-down module comprises a second switch transistor. A control end of the second switch transistor is coupled to the output end of the first switch transistor of the pull-down control module. An input end of the second switch transistor is coupled to the output end of the first switch transistor of the pull-down control module. An output end of the second switch transistor outputs the low-level scan signal of the scan line.

In the scan driving circuit of the present invention, the reset control module comprises a third switch transistor. The low-level scan signal is inputted to a control end of the third switch transistor. The next-stage clock signal is inputted to an input of the third switch transistor. An output end of the third switch transistor outputs the reset signal of the scan line.

In the scan driving circuit of the present invention, the reset module comprises a fourth switch transistor, a fifth switch transistor, a sixth switch transistor, and a seventh switch transistor;

A control end of the fourth switch transistor is coupled to the output end of the third switch transistor, an input end of the fourth switch transistor is coupled to the constant low-level voltage source, and an output end of the fourth switch transistor is coupled to a control end of the fifth switch transistor, a control end of the seventh switch transistor, and a control end of the sixth switch transistor;

An input end of the fifth switch transistor is coupled to the constant high-level voltage source, and an output end of the fifth switch transistor is coupled to the output end of the second switch transistor;

A control end of the sixth switch transistor is coupled to the output end of the second switch transistor, and an input end of the sixth switch transistor is coupled to the constant high-level voltage source;

An input end of the seventh switch transistor is coupled to the constant high-level voltage source, and an output end of the seventh switch transistor outputs the present-stage scan signal of the scan line.

In the scan driving circuit of the present invention, the down-stream module comprises an eighth switch transistor. A control end of the eighth switch transistor is coupled to the output end of the second switch transistor. An input end of the eighth switch transistor is coupled to the output end of the seventh switch transistor. An output end of the eighth switch transistor outputs the present-stage clock signal.

In the scan driving circuit of the present invention, the reset module comprises a tenth switch transistor. A control end of the tenth switch transistor is coupled to a next-two-stage clock signal. An input end of the tenth switch transistor is coupled to the constant high-level voltage source. An output end of the tenth switch transistor is coupled to the output end of the fourth switch transistor.

In the scan driving circuit of the present invention, the reset module comprises a tenth switch transistor. A control end of the tenth switch transistor is coupled to the output end of first switch transistor. An input end of the tenth switch transistor is coupled to the constant high-level voltage source. An output end of the tenth switch transistor is coupled to the output end of the fourth switch transistor.

In the scan driving circuit of the present invention, the reset module comprises a tenth switch transistor, a control end of the tenth switch transistor is coupled to the control end of the second switch transistor and a previous-stage pull-down control signal, an input end of the tenth switch transistor is coupled to the constant high-level voltage source, and an output end of the tenth switch transistor is coupled to the output end of the fourth switch transistor;

The down-stream module comprises an eighth switch transistor and an eleventh switch transistor, a control end of the eighth switch transistor is coupled to the output end of the second switch transistor, an input end of the eighth switch transistor is coupled to the output end of the seventh switch transistor, and an output end of the eighth switch transistor outputs the present-stage clock signal;

A control end of the eleventh switch transistor is coupled to the output end of the second switch transistor, an input end of the eleventh switch transistor is coupled to the output end of the eighth switch transistor, and an output end of the eleventh switch transistor outputs the present-stage pull-down control signal.

In the scan driving circuit of the present invention, the reset module further comprises a twelfth switch transistor, a control end of the twelfth switch transistor is coupled to the output end of the fourth switch transistor, an input end of the twelfth switch transistor is coupled to the constant high-level voltage source, and an output end of the twelfth switch transistor is coupled to the output end of the eleventh switch transistor.

A scan driving circuit provided by an embodiment of the present invention is utilized for executing a driving operation for cascaded scan lines and comprises:

A pull-down control module utilized for receiving a previous-stage scan signal and generating a low-level scan signal corresponding one of the scan lines according to the previous-stage scan signal;

A pull-down module utilized for pulling down a scan signal of the corresponding scan line according to the low-level scan signal;

A reset control module utilized for receiving a next-stage clock signal and generating a reset signal of the corresponding scan line according to the next-stage clock signal;

A reset module utilized for pulling up the scan signal of the corresponding scan line according to the reset signal;

A down-stream module utilized for generating and transmitting a present-stage clock signal according to the scan signal of the scan line;

A first bootstrap capacitor utilized for generating a high level or a low level of the scan signal of the scan line;

A constant low-level voltage source utilized for providing a low-level signal; and A constant high-level voltage source utilized for providing a high-level signal.

In the scan driving circuit of the present invention, the pull-down control module comprises a first switch transistor. The low-level scan signal is inputted to a control end of the first switch transistor. The previous-stage scan signal is inputted to an input end of the first switch transistor. An output end of the first switch transistor is coupled to the pull-down module.

In the scan driving circuit of the present invention, the pull-down module comprises a second switch transistor. A control end of the second switch transistor is coupled to the output end of the first switch transistor of the pull-down control module. An input end of the second switch transistor is coupled to the output end of the first switch transistor of the pull-down control module. An output end of the second switch transistor outputs the low-level scan signal of the scan line.

In the scan driving circuit of the present invention, the reset control module comprises a third switch transistor. The low-level scan signal is inputted to a control end of the third switch transistor. The next-stage clock signal is inputted to an input of the third switch transistor. An output end of the third switch transistor outputs the reset signal of the scan line.

In the scan driving circuit of the present invention, the reset module comprises a fourth switch transistor, a fifth switch transistor, a sixth switch transistor, and a seventh switch transistor;

A control end of the fourth switch transistor is coupled to the output end of the third switch transistor, an input end of the fourth switch transistor is coupled to the constant low-level voltage source, an output end of the fourth switch transistor is coupled to a control end of the fifth switch transistor, a control end of the seventh switch transistor, and a control end of the sixth switch transistor;

An input end of the fifth switch transistor is coupled to the constant high-level voltage source, and an output end of the fifth switch transistor is coupled to the output end of the second switch transistor;

A control end of the sixth switch transistor is coupled to the output end of the second switch transistor, and an input end of the sixth switch transistor is coupled to the constant high-level voltage source;

An input end of the seventh switch transistor is coupled to the constant high-level voltage source, and an output end of the seventh switch transistor outputs the present-stage scan signal of the scan line.

In the scan driving circuit of the present invention, the down-stream module comprises an eighth switch transistor. A control end of the eighth switch transistor is coupled to the output end of the second switch transistor. An input end of the eighth switch transistor is coupled to the output end of the seventh switch transistor. An output end of the eighth switch transistor outputs the present-stage clock signal.

In the scan driving circuit of the present invention, the reset module comprises a tenth switch transistor A control end of the tenth switch transistor is coupled to a next-two-stage clock signal. An input end of the tenth switch transistor is coupled to the constant high-level voltage source. An output end of the tenth switch transistor is coupled to the output end of the fourth switch transistor.

In the scan driving circuit of the present invention, the reset module comprises a tenth switch transistor. A control end of the tenth switch transistor is coupled to the output end of first switch transistor. An input end of the tenth switch transistor is coupled to the constant high-level voltage source. An output end of the tenth switch transistor is coupled to the output end of the fourth switch transistor.

In the scan driving circuit of the present invention, the reset module comprises a tenth switch transistor, a control end of the tenth switch transistor is coupled to the control end of the second switch transistor and a previous-stage pull-down control signal, an input end of the tenth switch transistor is coupled to the constant high-level voltage source, and an output end of the tenth switch transistor is coupled to the output end of the fourth switch transistor;

The down-stream module comprises an eighth switch transistor and an eleventh switch transistor, a control end of the eighth switch transistor is coupled to the output end of the second switch transistor, an input end of the eighth switch transistor is coupled to the output end of the seventh switch transistor, and an output end of the eighth switch transistor outputs the present-stage clock signal;

A control end of the eleventh switch transistor is coupled to the output end of the second switch transistor, an input end of the eleventh switch transistor is coupled to the output end of the eighth switch transistor, and an output end of the eleventh switch transistor outputs a present-stage pull-down control signal.

In the scan driving circuit of the present invention, the reset module further comprises a twelfth switch transistor. A control end of the twelfth switch transistor is coupled to the output end of the fourth switch transistor. An input end of the twelfth switch transistor is coupled to the constant high-level voltage source. An output end of the twelfth switch transistor is coupled to the output end of the eleventh switch transistor.

Comparing with a conventional scan driving circuit, the scan driving circuit of the present invention increases the reliability thereof by disposing the pull-down control module and the reset control module. Meanwhile, the whole structure of the scan driving circuit is simple. Accordingly, the technical problems that the structure of the conventional scan driving circuit is complex and the reliability is low are solved.

For a better understanding of the aforementioned content of the present invention, preferable embodiments are illustrated in accordance with the attached figures for further explanation.

DETAILED DESCRIPTION OF THE INVENTION

Figure 1:
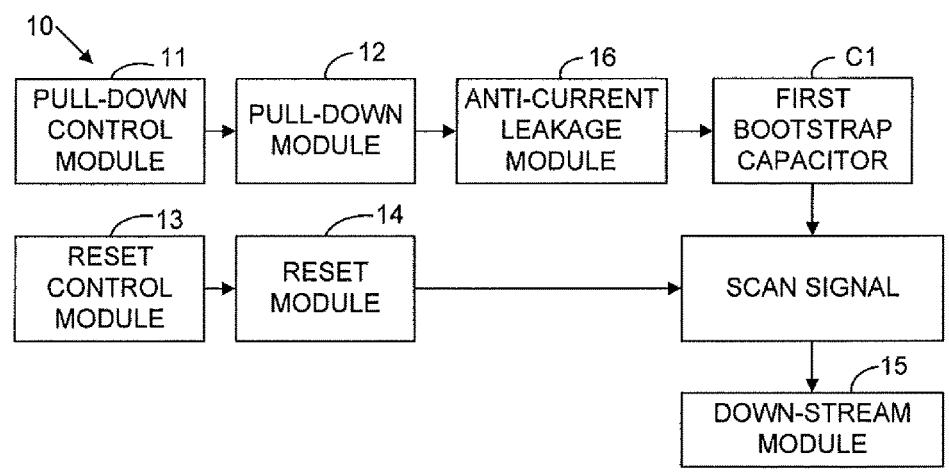
FIG. 1 shows a block diagram of a scan driving circuit in accordance with a preferred embodiment of the present invention.

The following embodiments are referring to the accompanying drawings for exemplifying specific implementable embodiments of the present invention. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

In the drawings, structure-like elements are labeled with like reference numerals.

Please refer to FIG. 1. FIG. 1 shows a block diagram of a scan driving circuit in accordance with a preferred embodiment of the present invention. The scan driving circuit is utilized for executing a driving operation for cascaded scan lines. The scan driving circuit 10 comprises a pull-down control module 11, a pull-down module 12, a reset control module 13, a reset module 14, a down-stream module 15, an anti-current leakage module 16, a first bootstrap capacitor C1, a constant low-level voltage source VGL, and a constant high-level voltage source VGH.

The pull-down control module 11 is utilized for receiving a previous-stage scan signal G_N−1 and generating a low-level scan signal corresponding one of the scan lines according to the previous-stage scan signal G_N−1. The pull-down module is utilized for pulling down a scan signal G_N of the corresponding scan line according to the low-level scan signal. The reset control module is utilized for receiving a next-stage clock signal CK_N+1 and generating a reset signal of the corresponding scan line according to the next-stage clock signal CK_N+1. The reset module is utilized for pulling up the scan signal G_N of the corresponding scan line. The down-stream module is utilized for generating and transmitting a present-stage clock signal CK_N according to the scan signal G_N of the corresponding scan line. The first bootstrap capacitor C1 is utilized for generating a low-level or a high-level of the scan signal of the scan line. The constant low-level voltage source VGL is utilized for providing a low-level signal. The constant high-level voltage source VGH is utilized for providing a high-level signal.

Figure 2:
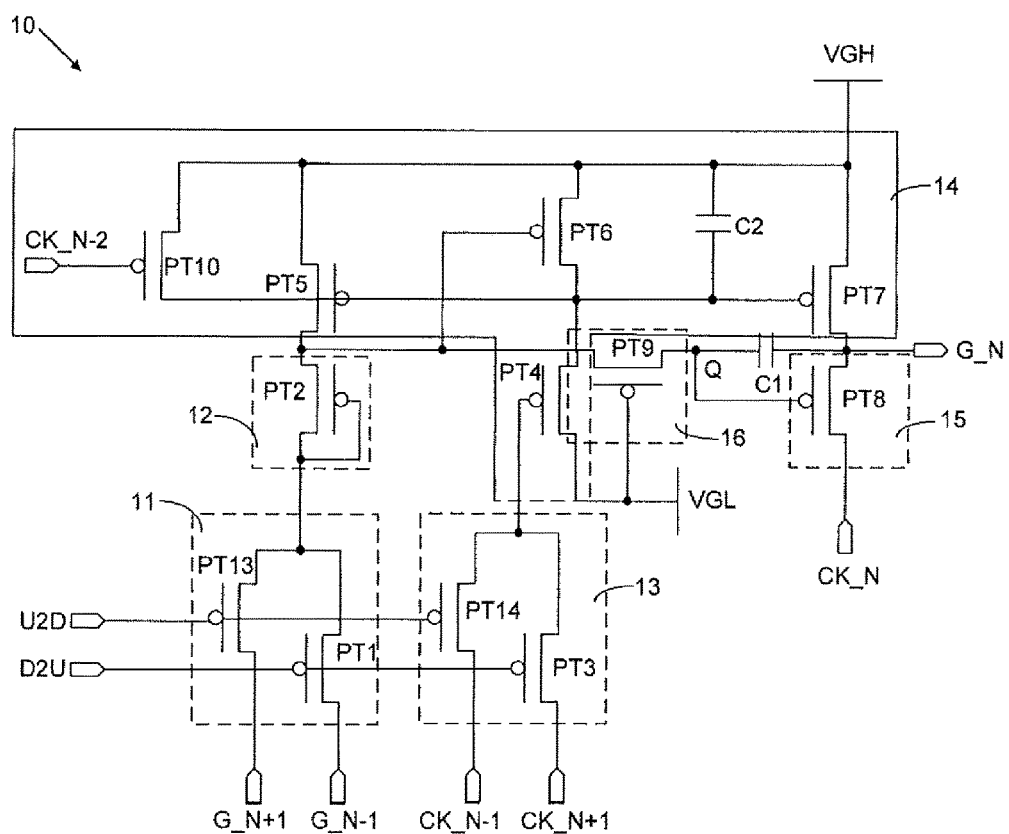
FIG. 2 shows a specific circuit diagram of the scan driving circuit in accordance with a first preferred embodiment of the present invention.

Please refer to FIG. 2. FIG. 2 shows a specific circuit diagram of the scan driving circuit in accordance with a first preferred embodiment of the present invention. In the present preferred embodiment of the present invention, the pull-down control module 10 comprises a first switch transistor PT1. A low-level scan signal D2U is inputted to a control end of the first switch transistor PT1. The previous-stage scan signal G_N−1 is inputted to an input end of the first switch transistor PT1. An output end of the first switch transistor PT1 is coupled to the pull-down module 12 and outputs the previous-stage scan signal G_N−1 to the pull-down module 12.

The pull-down module 12 comprises a second switch transistor PT2. A control end of the second switch transistor PT2 is coupled to the output end of the first switch transistor PT1. An input end of the second switch transistor PT2 is coupled to the output end of the first switch transistor PT1. An output end of the second switch transistor PT2 outputs the previous-stage low-level scan signal G_N−1.

The reset control module 13 comprises a third switch transistor PT3. The low-level scan signal D2U is inputted to a control end of the third switch transistor PT3. The next-stage clock signal CK_N+1 is inputted to an input of the third switch transistor PT3. An output end of the third switch transistor PT3 outputs the reset signal of the scan line, that is, outputs the next-stage clock signal CK_N+1.

The reset module 14 comprises a fourth switch transistor PT4, a fifth switch transistor PT5, a sixth switch transistor PT6, a seventh switch transistor PT7, a tenth switch transistor PT10, and a second bootstrap capacitor C2. A control end of the fourth switch transistor PT4 is coupled to the output end of the third switch transistor PT3. An input end of the fourth switch transistor PT4 is coupled to the constant low-level voltage source VGL. An output end of the fourth switch transistor PT4 is coupled to a control end of the fifth switch transistor PT5, a control end of the seventh switch transistor PT7, an output end of the sixth switch transistor PT6, and an output end of the tenth switch transistor PT10.

An input end of the fifth switch transistor PT5 is coupled to the constant high-level voltage source VGH. An output end of the fifth switch transistor PT5 is coupled to the output end of the second switch transistor PT2.

A control end of the sixth switch transistor PT6 is coupled to the output end of the second switch transistor PT2. An input end of the sixth switch transistor PT6 is coupled to the constant high-level voltage source VGH.

An input end of the seventh switch transistor PT7 is coupled to the constant high-level voltage source VGH. An output end of the seventh switch transistor PT7 outputs the present-stage scan signal G_N of the scan line.

An input end of the tenth switch transistor PT10 is coupled to the constant high-level voltage source VGH. A previous-two-stage clock signal CK_N−2 is inputted to a control end of the tenth switch transistor PT10.

One end of the second bootstrap C2 is coupled to the constant high-level voltage source VGH. The other end of the second bootstrap C2 is coupled to the output end of the fourth switch transistor PT4.

The down-stream module 15 comprises an eighth switch transistor PT8. A control end of the eighth switch transistor PT8 is coupled to the output end of the second switch transistor PT2. An input end of the eighth switch transistor PT8 is coupled to the output end of the seventh switch transistor PT7. An output end of the eighth switch transistor PT8 outputs the present-stage clock signal CK_N.

One end of the first bootstrap C1 is coupled to the output end of the second switch transistor PT2. The other end of the first bootstrap C1 is coupled to the output end of the seventh switch transistor PT7.

The anti-current leakage module 16 comprises a ninth switch transistor PT9. A control end of the ninth switch transistor PT9 is coupled to the constant low-level voltage source VGL. An input end of the ninth switch transistor PT9 is coupled to the output end of the second switch transistor PT2. An output end of the ninth switch transistor PT9 is coupled to the output end of the seventh switch transistor PT7 via the first bootstrap capacitor C1.

Figure 6:
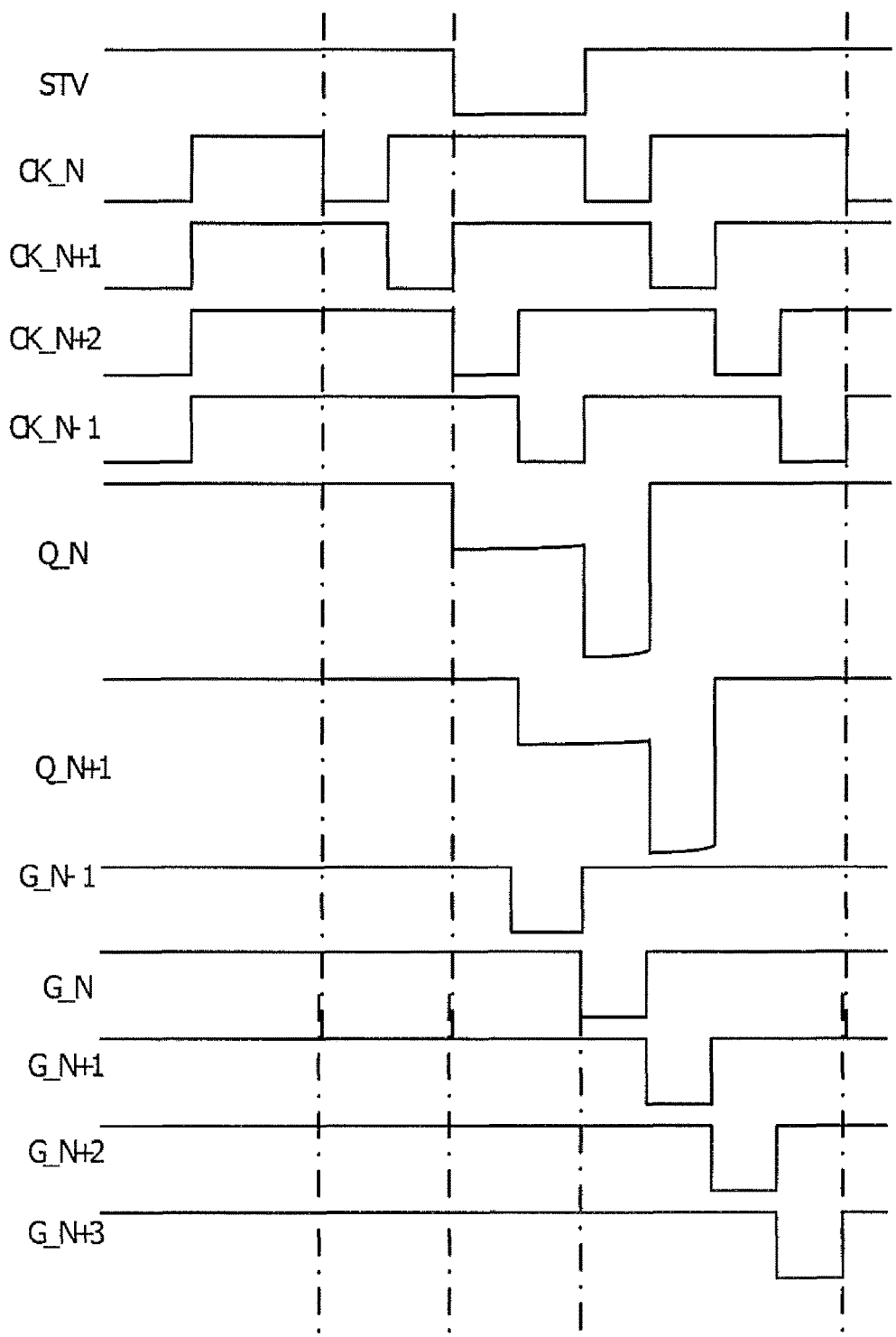
FIG. 6 shows a signal waveform diagram of the scan driving circuit in accordance with the present preferred embodiment of the present invention.

A specific working principle of the scan driving circuit in accordance with the preferred embodiment of the present invention is described in detail as follows by combining FIG. 2 with FIG. 6. FIG. 6 shows a signal waveform diagram of the scan driving circuit in accordance with the present preferred embodiment of the present invention. Clock signals CK_N are cycled to output every four ones. That is, waveforms of CK_N+2 and CK_N−2 are the same. Firstly, a previous-two-stage scan signal G_N−2 is a low-level signal, and then the tenth switch transistor PT10 is turned on. The constant high-level voltage source VGH is inputted to the control end of the fifth switch transistor PT5 and the control end of the seventh switch transistor PT7, so as to ensure that the fifth switch transistor PT5 and the seventh switch transistor PT7 are in a turned-off state.

Then, the previous-stage scan signal G_N−1 is a low-level signal. The first switch transistor PT1 of the pull-down control module 11 is in a turned-on state under control of the low-level scan signal D2U. Accordingly, the output end of the first switch transistor PT1 outputs the previous-stage scan signal G_N−1 to the input end and the control end of the second switch transistor PT2 of the pull-down module 12.

A low-level signal G_N−1 is inputted to the control end of the second switch transistor PT2 of the pull-down module 12, and thus the second switch transistor PT2 is in a turned-on state. The output end of the second switch transistor PT2 outputs the low-level signal G_N−1.

Meanwhile, the control end of the sixth switch transistor PT6 of the reset module 14 receives the low-level signal G_N−1 which is outputted by the output end of the second switch transistor PT2. Accordingly, the sixth switch transistor PT6 is turned on. The control end of the fifth switch transistor PT5 and the control end of the seventh switch transistor PT7 are coupled to the constant high-level voltage source VGH via the sixth switch transistor PT6, and thus the fifth switch transistor PT5 and the seventh switch transistor PT7 are turned off.

The ninth switch transistor PT9 of the anti-current leakage module 16 is turned on under control of the constant low-level voltage source VGL. The low-level signal G_N−1 which is outputted by the second switch transistor PT2 of the pull-down module 12 functions on the first bootstrap capacitor C1 via the ninth switch transistor PT9, so as to lower the level of the Q_N. G_N also outputs a low-level signal. Meanwhile, the eighth switch transistor PT8 of the down-stream module 15 is turned on under control of Q_N. The output end of the eighth switch transistor PT8 outputs the present-stage low-level clock signal CK_N to a driving circuit of the previous-stage scan line.

When the next-stage clock signal CK_N+1 is turned to be in a low level, the next-stage clock signal CK_N+1 is inputted to the third switch transistor PT3 of the reset control module 13 under control of a low-level scan signal U2D. The output end of the third switch transistor PT3 outputs the clock signal CK_N+1 (i.e. the reset signal) to the reset module 14.

The fourth switch transistor PT4 of the reset module 14 is turned on under control of the reset signal. Meanwhile, the previous-two-stage scan signal G_N−2 is turned to be in a high level. The tenth switch transistor PT10 is turned off. The constant low-level voltage source VGL is inputted to the control end of the fifth switch transistor PT and the control end of the seventh switch transistor PT7 via the fourth switch transistor PT4. The fifth switch transistor PT5 and the seventh switch transistor PT7 are turned on. The high-level signal of the constant high-level voltage source VGH is inputted to a point Q via the fifth switch transistor PT5 to raise Q_N. Meanwhile, the high-level signal of the constant high-level voltage source VGH is inputted to G_N via the seventh switch transistor PT7 to raise G_N. Meanwhile, the eighth switch transistor PT8 is turned off, and the clock signal CK_N is turned to be in a high level.

As such, an output process of the cascaded low-level scan signals in the scan driving circuit 10 in accordance with the present preferred embodiment is implemented.

Preferably, the disposal of the second bootstrap capacitor C2 of the reset module 14 can raise the potentials of the control end of the fifth switch transistor PT5 and the control end of the seventh switch transistor PT7, so as to ensure that Q_N is in a low level.

Preferably, the pull-down control module 11 in accordance with the present preferred embodiment further comprises a thirteenth switch transistor PT13. The low-level scan signal U2D is inputted to a control end of the thirteenth switch transistor PT13. The next-stage scan signal G_N+1 is inputted to an input end of the thirteenth switch transistor PT13. An output end of the thirteenth switch transistor PT13 is coupled to the pull-down module 12. As such, the pull-down control module 11 can receive the next-stage scan signal G_N+1 and generate the low-level scan signal of the corresponding scan signal according to the next-stage scan signal G_N+1.

Meanwhile, the reset control module 13 in accordance with the present preferred embodiment further comprises a fourteenth switch transistor PT14. The low-level scan signal U2D is inputted to a control end of the fourteenth switch transistor PT14. The previous-stage clock signal CK_N−1 is inputted to an input end of the fourteenth switch transistor PT14. An output end of the fourteenth switch transistor PT14 outputs the reset signal of the scan line. As such, the reset control module 13 can receive the previous-stage clock signal CK_N−1 and generate the reset signal of the corresponding scan signal according to the previous-stage scan signal CK_N−1.

As such, the scan driving circuit 10 in accordance with the present preferred embodiment can implement a scan function in a reverse direction by utilizing the thirteenth switch transistor PT13 and the fourteenth switch transistor PT14.

Preferably, the scan driving circuit 10 in accordance with the present preferred embodiment utilizes P-type MOSFETs (Metal-Oxide-Semiconductor Field-Effect Transistor) to control the pull-down control module 11, the pull-down module 12, the reset control module 13, and the reset module 14. Certainly, N-type MOSFETs can be utilized to control the pull-down control module 11, the pull-down module 12, the reset control module 13, and the reset module 14.

The scan driving circuit of the present invention controls the tenth switch transistor PT10 of the reset module 14 via the previous-two-stage scan signal G_N−2, so as to preferably ensure that the fifth switch transistor PT5 and the seventh switch transistor PT7 are in a turned-off state when the point Q is charged. Accordingly, it is ensured that the point Q is in a low-level state, and the reliability of the scan driving circuit is increased. Meanwhile, the whole structure of the scan driving circuit is simple.

Figure 3:
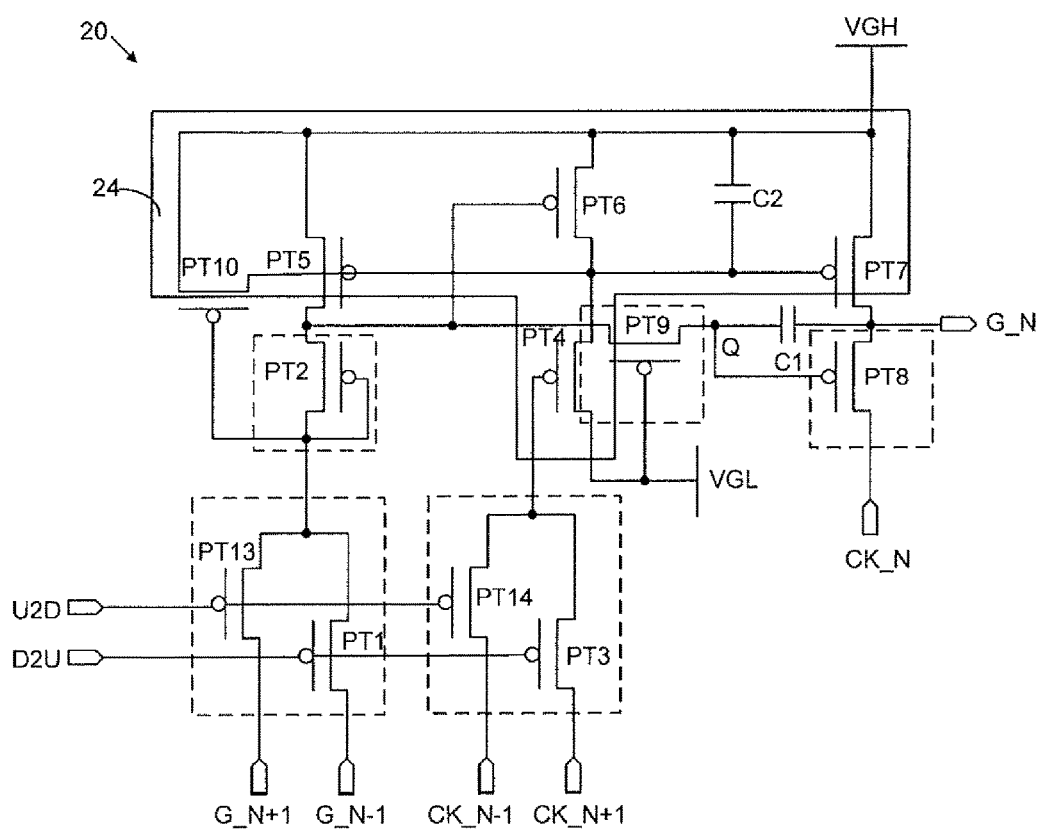
FIG. 3 shows a specific circuit diagram of a scan driving circuit in accordance with a second preferred embodiment of the present invention.

Please refer to FIG. 3. FIG. 3 shows a specific circuit diagram of a scan driving circuit in accordance with a second preferred embodiment of the present invention. In the scan driving circuit 20 in accordance with the present preferred embodiment based on the first preferred embodiment, a control end of a tenth switch transistor PT10 of a reset module 24 is coupled to an output end of a first switch transistor PT1. As such, when the first switch transistor PT1 outputs a previous-stage low-level scan signal G_N−1, the tenth switch transistor PT10 can be turned on to ensure that fifth switch transistor PT5 and the seventh switch transistor PT7 are turned off and to avoid occurrence of current leakage phenomenon at a point Q.

As a result, the scan driving circuit in accordance with the present embodiment can preferably ensure that the fifth switch transistor PT5 and the seventh switch transistor PT7 are in a turned-off state when the point Q is charged. Accordingly, it is ensured that the point Q is in a low-level state and the reliability of the scan driving circuit is increased. Meanwhile, the whole structure of the scan driving circuit is simple.

Figure 4:
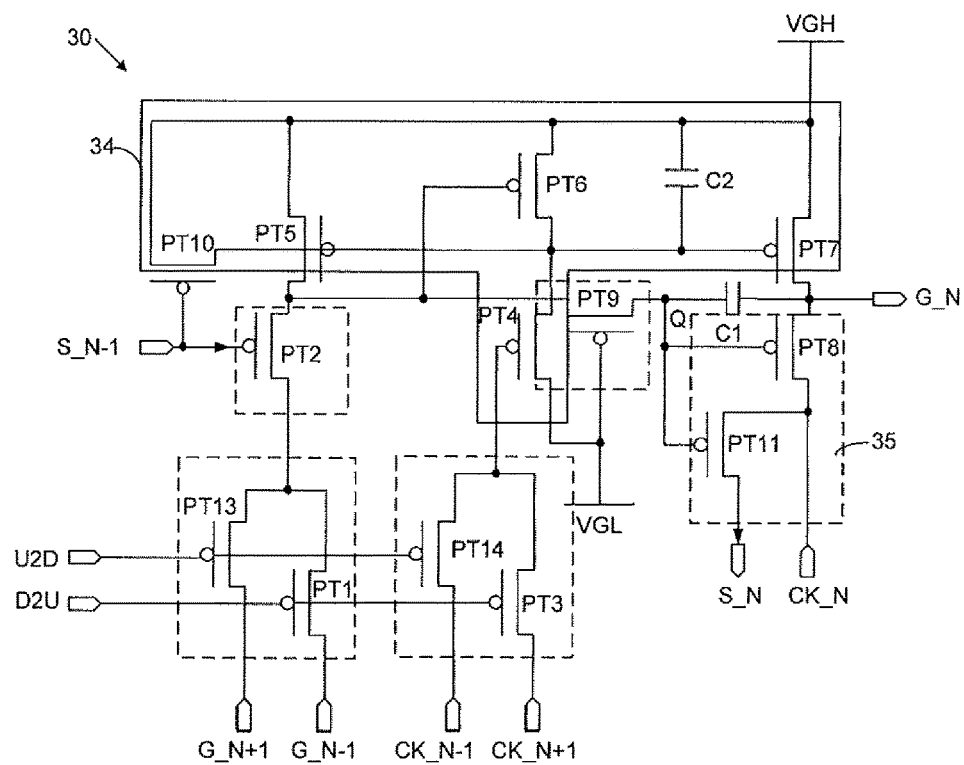
FIG. 4 shows a specific circuit diagram of a scan driving circuit in accordance with a third preferred embodiment of the present invention.

Please refer to FIG. 4. FIG. 4 shows a specific circuit diagram of a scan driving circuit in accordance with a third preferred embodiment of the present invention. In the scan driving circuit 30 in accordance with the present preferred embodiment based on the first preferred embodiment, a previous-stage pull-down control signal S_N−1 in inputted to a control end of a tenth switch transistor PT10 of a reset module 34. An input end of the tenth switch transistor PT10 is coupled to the constant high-level voltage source VGH. An output end of the tenth switch transistor PT10 is coupled to an output end of a fourth switch transistor PT4. Meanwhile, the previous-stage pull-down control signal S_N−1 is also inputted to a control end of a second switch transistor PT2.

Meanwhile, a down-stream module 35 further comprises an eleventh switch transistor PT11. A control end of the eleventh switch transistor PT11 is coupled to an output end of a second switch transistor PT2. An input end of the eleventh switch transistor PT11 is coupled to an output end of an eighth switch transistor PT8. An output end of the eleventh switch transistor PT11 outputs a present-stage pull-down control signal S_N to a driving circuit of a previous-stage scan line.

The driving circuit in accordance with the present preferred embodiment implements delay transmission of the scan signal of each stage of the scan lines by utilizing the pull-down control signal S_N, thereby avoiding the current leakage problem because the scan signals and the clock signals are not matched.

Accordingly, the scan driving circuit in accordance with the present preferred embodiment based on the first preferred embodiment further increases the reliability and the stability of the scan driving current.

Figure 5:
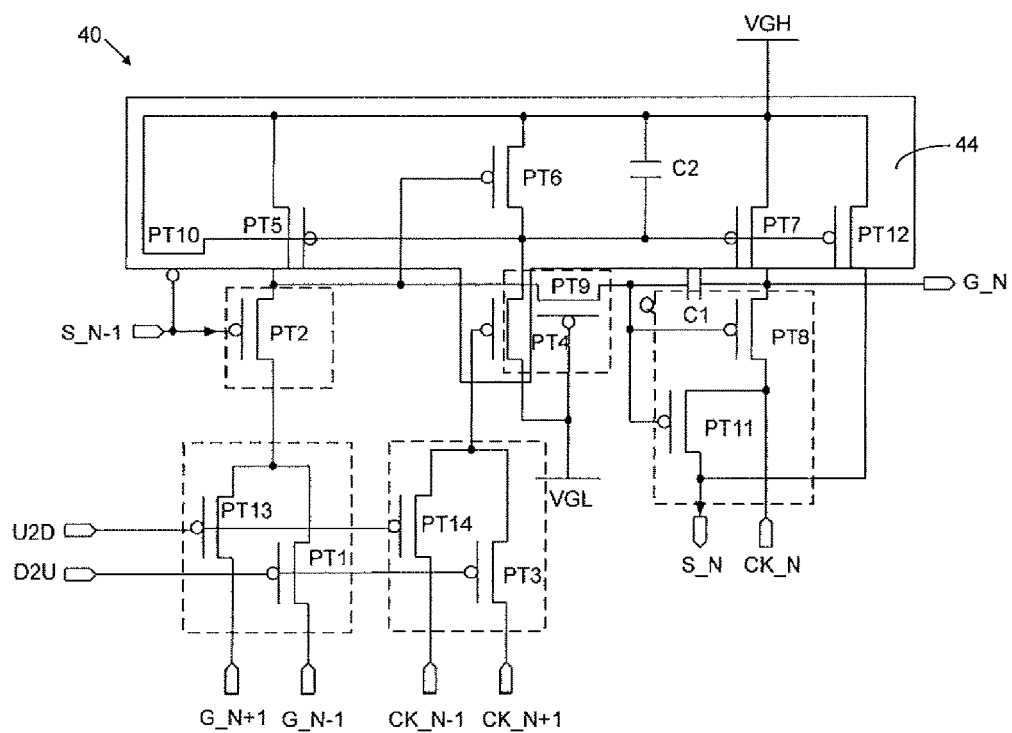
FIG. 5 shows a specific circuit diagram of a scan driving circuit in accordance with a fourth preferred embodiment of the present invention.

Please refer to FIG. 5. FIG. 5 shows a specific circuit diagram of a scan driving circuit in accordance with a fourth preferred embodiment of the present invention. In the scan driving circuit 40 in accordance with the present preferred embodiment based on the third preferred embodiment, a reset module 44 further comprises a twelfth switch transistor PT12. A control end of the twelfth switch transistor PT12 is coupled to an output end of a fourth switch transistor PT4. An input end of the twelfth switch transistor PT12 is coupled to the constant high-level voltage source VGH. An output end of the twelfth switch transistor PT12 is coupled to an input end of the eleventh switch transistor PT11. The twelfth switch transistor PT12 is disposed to rapidly increase the potential of the pull-down control signal S_N via the twelfth switch transistor PT12 when the potential of the point Q is increased, thereby avoiding that a driving circuit of a next-stage scan line is affected because the potential of the pull-down control signal S_N is not accurate.

Accordingly, the scan driving circuit in accordance with the present preferred embodiment based on the third preferred embodiment further increases the reliability and the stability of the scan driving current.

The scan driving circuit of the present invention increases the reliability thereof by disposing the pull-down control module and the reset control module. Meanwhile, the whole structure of the scan driving circuit is simple. Accordingly, the technical problems that the structure of a conventional scan driving circuit is complex and the reliability is low are solved.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structures.

What is claimed is:

1. A scan driving circuit, utilized for executing a driving operation for cascaded scan lines, comprising:
   a pull-down control module utilized for receiving a previous-stage scan signal and generating a low-level scan signal corresponding one of the scan lines according to the previous-stage scan signal;
   a pull-down module utilized for pulling down a scan signal of the corresponding scan line according to the low-level scan signal;
   a reset control module utilized for receiving a next-stage clock signal and generating a reset signal of the corresponding scan line according to the next-stage clock signal;
   a reset module utilized for pulling up the scan signal of the corresponding scan line according to the reset signal;
   a down-stream module utilized for generating and transmitting a present-stage clock signal and a present-stage pull-down control signal according to the scan signal of the scan line;
   a first bootstrap capacitor utilized for generating a high level or a low level of the scan signal of the scan line;
   a constant low-level voltage source utilized for providing a low-level signal; and
   a constant high-level voltage source utilized for providing a high-level signal;
   wherein the scan driving circuit utilizes P-type metal-oxide-semiconductor field-effect transistors or N-type metal-oxide-semiconductor field-effect transistors to control the pull-down control module, the pull-down module, the reset control module, and the reset module;
   the pull-down control module further receives a next-stage scan signal and generates the low-level scan signal of the corresponding scan signal according to the next-stage scan signal;
   the reset control module further receives a previous-stage clock signal and generates the reset signal of the corresponding scan signal according to the previous-stage scan signal.

2. The scan driving circuit of claim 1, wherein the pull-down control module comprises a first switch transistor, the low-level scan signal is inputted to a control end of the first switch transistor, the previous-stage scan signal is inputted to an input end of the first switch transistor, and an output end of the first switch transistor is coupled to the pull-down module.

3. The scan driving circuit of claim 2, wherein the pull-down module comprises a second switch transistor, a control end of the second switch transistor is coupled to the output end of the first switch transistor of the pull-down control module, an input end of the second switch transistor is coupled to the output end of the first switch transistor of the pull-down control module, and an output end of the second switch transistor outputs the low-level scan signal of the scan line.

4. The scan driving circuit of claim 3, wherein the reset control module comprises a third switch transistor, the low-level scan signal is inputted to a control end of the third switch transistor, the next-stage clock signal is inputted to an input of the third switch transistor, and an output end of the third switch transistor outputs the reset signal of the scan line.

5. The scan driving circuit of claim 4, wherein the reset module comprises a fourth switch transistor, a fifth switch transistor, a sixth switch transistor, and a seventh switch transistor;
   a control end of the fourth switch transistor is coupled to the output end of the third switch transistor, an input end of the fourth switch transistor is coupled to the constant low-level voltage source, and an output end of the fourth switch transistor is coupled to a control end of the fifth switch transistor, a control end of the seventh switch transistor, and a control end of the sixth switch transistor;
   an input end of the fifth switch transistor is coupled to the constant high-level voltage source, and an output end of the fifth switch transistor is coupled to the output end of the second switch transistor;
   a control end of the sixth switch transistor is coupled to the output end of the second switch transistor, and an input end of the sixth switch transistor is coupled to the constant high-level voltage source;
   an input end of the seventh switch transistor is coupled to the constant high-level voltage source, and an output end of the seventh switch transistor outputs the present-stage scan signal of the scan line.

6. The scan driving circuit of claim 5, wherein the down-stream module comprises an eighth switch transistor, a control end of the eighth switch transistor is coupled to the output end of the second switch transistor, an input end of the eighth switch transistor is coupled to the output end of the seventh switch transistor, and an output end of the eighth switch transistor outputs the present-stage clock signal.

7. The scan driving circuit of claim 5, wherein the reset module comprises a tenth switch transistor, a control end of the tenth switch transistor is coupled to a next-two-stage clock signal, an input end of the tenth switch transistor is coupled to the constant high-level voltage source, and an output end of the tenth switch transistor is coupled to the output end of the fourth switch transistor.

8. The scan driving circuit of claim 5, wherein the reset module comprises a tenth switch transistor, a control end of the tenth switch transistor is coupled to the output end of first switch transistor, an input end of the tenth switch transistor is coupled to the constant high-level voltage source, and an output end of the tenth switch transistor is coupled to the output end of the fourth switch transistor.

9. The scan driving circuit of claim 5, wherein the reset module comprises a tenth switch transistor, a control end of the tenth switch transistor is coupled to the control end of the second switch transistor and a previous-stage pull-down control signal, an input end of the tenth switch transistor is coupled to the constant high-level voltage source, and an output end of the tenth switch transistor is coupled to the output end of the fourth switch transistor;
   the down-stream module comprises an eighth switch transistor and an eleventh switch transistor, a control end of the eighth switch transistor is coupled to the output end of the second switch transistor, an input end of the eighth switch transistor is coupled to the output end of the seventh switch transistor, and an output end of the eighth switch transistor outputs the present-stage clock signal;
   a control end of the eleventh switch transistor is coupled to the output end of the second switch transistor, an input end of the eleventh switch transistor is coupled to the output end of the eighth switch transistor, and an output end of the eleventh switch transistor outputs the present-stage pull-down control signal.

10. The display panel of claim 9, wherein the reset module further comprises a twelfth switch transistor, a control end of the twelfth switch transistor is coupled to the output end of the fourth switch transistor, an input end of the twelfth switch transistor is coupled to the constant high-level voltage source, and an output end of the twelfth switch transistor is coupled to the output end of the eleventh switch transistor.

11. A scan driving circuit, utilized for executing a driving operation for cascaded scan lines, comprising:
- a pull-down control module utilized for receiving a previous-stage scan signal and generating a low-level scan signal corresponding one of the scan lines according to the previous-stage scan signal;
- a pull-down module utilized for pulling down a scan signal of the corresponding scan line according to the low-level scan signal;
- a reset control module utilized for receiving a next-stage clock signal and generating a reset signal of the corresponding scan line according to the next-stage clock signal;
- a reset module utilized for pulling up the scan signal of the corresponding scan line according to the reset signal;
- a down-stream module utilized for generating and transmitting a present-stage clock signal according to the scan signal of the scan line;
- a first bootstrap capacitor utilized for generating a high level or a low level of the scan signal of the scan line;
- a constant low-level voltage source utilized for providing a low-level signal; and
- a constant high-level voltage source utilized for providing a high-level signal.

12. The scan driving circuit of claim 11, wherein the pull-down control module comprises a first switch transistor, the low-level scan signal is inputted to a control end of the first switch transistor, the previous-stage scan signal is inputted to an input end of the first switch transistor, and an output end of the first switch transistor is coupled to the pull-down module.

13. The scan driving circuit of claim 12, wherein the pull-down module comprises a second switch transistor, a control end of the second switch transistor is coupled to the output end of the first switch transistor of the pull-down control module, an input end of the second switch transistor is coupled to the output end of the first switch transistor of the pull-down control module, and an output end of the second switch transistor outputs the low-level scan signal of the scan line.

14. The scan driving circuit of claim 13, wherein the reset control module comprises a third switch transistor, the low-level scan signal is inputted to a control end of the third switch transistor, the next-stage clock signal is inputted to an input of the third switch transistor, and an output end of the third switch transistor outputs the reset signal of the scan line.

15. The scan driving circuit of claim 14, wherein the reset module comprises a fourth switch transistor, a fifth switch transistor, a sixth switch transistor, and a seventh switch transistor;
- a control end of the fourth switch transistor is coupled to the output end of the third switch transistor, an input end of the fourth switch transistor is coupled to the constant low-level voltage source, an output end of the fourth switch transistor is coupled to a control end of the fifth switch transistor, a control end of the seventh switch transistor, and a control end of the sixth switch transistor;
- an input end of the fifth switch transistor is coupled to the constant high-level voltage source, and an output end of the fifth switch transistor is coupled to the output end of the second switch transistor;
- a control end of the sixth switch transistor is coupled to the output end of the second switch transistor, and an input end of the sixth switch transistor is coupled to the constant high-level voltage source;
- an input end of the seventh switch transistor is coupled to the constant high-level voltage source, and an output end of the seventh switch transistor outputs the present-stage scan signal of the scan line.

16. The scan driving circuit of claim 15, wherein the down-stream module comprises an eighth switch transistor, a control end of the eighth switch transistor is coupled to the output end of the second switch transistor, an input end of the eighth switch transistor is coupled to the output end of the seventh switch transistor, and an output end of the eighth switch transistor outputs the present-stage clock signal.

17. The scan driving circuit of claim 15, wherein the reset module comprises a tenth switch transistor, a control end of the tenth switch transistor is coupled to a next-two-stage clock signal, an input end of the tenth switch transistor is coupled to the constant high-level voltage source, and an output end of the tenth switch transistor is coupled to the output end of the fourth switch transistor.

18. The scan driving circuit of claim 15, wherein the reset module comprises a tenth switch transistor, a control end of the tenth switch transistor is coupled to the output end of first switch transistor, an input end of the tenth switch transistor is coupled to the constant high-level voltage source, and an output end of the tenth switch transistor is coupled to the output end of the fourth switch transistor.

19. The scan driving circuit of claim 15, wherein the reset module comprises a tenth switch transistor, a control end of the tenth switch transistor is coupled to the control end of the second switch transistor and a previous-stage pull-down control signal, an input end of the tenth switch transistor is coupled to the constant high-level voltage source, and an output end of the tenth switch transistor is coupled to the output end of the fourth switch transistor;
- the down-stream module comprises an eighth switch transistor and an eleventh switch transistor, a control end of the eighth switch transistor is coupled to the output end of the second switch transistor, an input end of the eighth switch transistor is coupled to the output end of the seventh switch transistor, and an output end of the eighth switch transistor outputs the present-stage clock signal;
- a control end of the eleventh switch transistor is coupled to the output end of the second switch transistor, an input end of the eleventh switch transistor is coupled to the output end of the eighth switch transistor, and an output end of the eleventh switch transistor outputs a present-stage pull-down control signal.

20. The scan driving circuit of claim 19, wherein the reset module further comprises a twelfth switch transistor, a control end of the twelfth switch transistor is coupled to the output end of the fourth switch transistor, an input end of the twelfth switch transistor is coupled to the constant high-level voltage source, and an output end of the twelfth switch transistor is coupled to the output end of the eleventh switch transistor.

* * * * *